US011728452B2

(12) United States Patent
Aiken et al.

(10) Patent No.: US 11,728,452 B2
(45) Date of Patent: *Aug. 15, 2023

(54) SOLAR CELL MODULE ON FLEXIBLE SUPPORTING FILM

(71) Applicant: SolAero Technologies Corp., Albuquerque, NM (US)

(72) Inventors: Daniel Aiken, Albuquerque, NM (US); Daniel Derkacs, Albuquerque, NM (US)

(73) Assignee: SolAero Techologies Corp., Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/742,891

(22) Filed: May 12, 2022

(65) Prior Publication Data

US 2022/0328711 A1 Oct. 13, 2022

Related U.S. Application Data

(60) Division of application No. 17/140,759, filed on Jan. 4, 2021, which is a division of application No. 16/998,636, filed on Aug. 20, 2020, now Pat. No. 10,978,602, which is a division of application No. 15/868,296, filed on Jan. 11, 2018, now Pat. No. 10,790,406, which is a continuation-in-part of
(Continued)

(51) Int. Cl.
| | |
|---|---|
| *H01L 31/05* | (2014.01) |
| *H01L 31/02* | (2006.01) |
| *H01L 31/048* | (2014.01) |
| *H01L 31/0725* | (2012.01) |
| *H01L 31/18* | (2006.01) |

(52) U.S. Cl.
CPC .... *H01L 31/0508* (2013.01); *H01L 31/02008* (2013.01); *H01L 31/0481* (2013.01); *H01L 31/0512* (2013.01); *H01L 31/0725* (2013.01); *H01L 31/02002* (2013.01); *H01L 31/02016* (2013.01); *H01L 31/184* (2013.01); *Y02E 10/50* (2013.01); *Y02P 70/50* (2015.11)

(58) Field of Classification Search
None
See application file for complete search history.

(56) References Cited

U.S. PATENT DOCUMENTS

| | | | | |
|---|---|---|---|---|
| 4,045,245 | A | * | 8/1977 | Coleman ............... H01L 31/042 |
| | | | | 136/251 |
| 5,506,401 | A | * | 4/1996 | Segawa ............. H01L 27/14618 |
| | | | | 250/208.1 |

(Continued)

*Primary Examiner* — Bethany L Martin

(57) ABSTRACT

A solar cell module comprising a plurality of solar cells mounted on a flexible support, the support comprising a conductive layer on the top surface thereof divided into two electrically isolated portions—a first conductive portion and a second conductive portion. Each solar cell comprises a front surface, a rear surface, and a first contact on the rear surface and a second contact on the front surface. Each one of the plurality of solar cells is placed on the first conductive portion with the first contact electrically connected to the first conductive portion so that the solar cells are connected through the first conductive portion. A second contact of each solar cell is then connected to the second conductive portion by a respective interconnect.

19 Claims, 14 Drawing Sheets

Related U.S. Application Data application No. 14/592,515, filed on Jan. 8, 2015, now abandoned.

(56) References Cited

U.S. PATENT DOCUMENTS

| | | | | |
|---|---|---|---|---|
| 7,732,243 B2* | 6/2010 | Luch | H01L 31/0392 | |
| | | | | 438/57 |
| 2007/0079863 A1* | 4/2007 | Stan | H01L 27/1421 | |
| | | | | 136/244 |
| 2009/0288699 A1* | 11/2009 | Auman | C08G 73/1042 | |
| | | | | 136/256 |
| 2010/0012172 A1* | 1/2010 | Meakin | H01L 31/049 | |
| | | | | 136/251 |
| 2010/0037936 A1* | 2/2010 | Becker | H05K 1/181 | |
| | | | | 136/248 |
| 2010/0282288 A1* | 11/2010 | Cornfeld | H01L 31/0508 | |
| | | | | 136/244 |
| 2012/0152325 A1* | 6/2012 | Podkin | H01L 31/02013 | |
| | | | | 438/66 |
| 2014/0338739 A1* | 11/2014 | Liu | B32B 38/10 | |
| | | | | 136/256 |
| 2015/0364631 A1* | 12/2015 | Aiken | H01L 31/022425 | |
| | | | | 136/251 |

\* cited by examiner

SOLAR CELL MODULE ON FLEXIBLE SUPPORTING FILM

REFERENCE TO RELATED APPLICATIONS

The present application is a division of U.S. patent application Ser. No. 17/140,759 filed Jan. 4, 2021, which is a divisional of U.S. patent application Ser. No. 16/998,636 filed Aug. 20, 2020, now U.S. Pat. No. 10,978,602, which was a division U.S. patent application Ser. No. 15/868,296 filed Jan. 11, 2018, now U.S. Pat. No. 10,790,406, which in turn is a continuation-in-part of U.S. patent application Ser. No. 14/592,519 filed Jan. 8, 2015, which claimed the benefit of U.S. Provisional Application No. 61/976,108 filed Apr. 7, 2014.

All of the above applications are hereby incorporated by reference in their entirety.

BACKGROUND OF THE DISCLOSURE

1. Field of the Disclosure

The disclosure relates to the field of photovoltaic semiconductors.

2. Description of the Related Art

Satellite and other space related applications typically use solar cells designed for use in the space environment, i.e., under the AM0 solar spectrum. Such space-qualified solar cells have a sequence of subcells with compositions and band gaps that have been optimized to achieve maximum efficiency for the AM0 spectrum, which is different from the compositions and band gaps of terrestrial solar cells, which are optimized for the AM1.5 solar spectrum.

Another distinctive difference between space-qualified solar cells and terrestrial solar cells is that a space-qualified solar cell must include a cover glass over the semiconductor device to provide radiation resistant shielding from electrons and protons in the space environment which could damage the semiconductor material, while terrestrial solar cells need not include a cover glass. The cover glass is typically a ceria doped borosilicate glass that is typically 4 mils in thickness and attached by a transparent adhesive to the solar cell.

A further distinctive difference between space-qualified solar cell arrays and terrestrial solar cell arrays is that a space-qualified solar cell array utilizes silver-plated metal material for interconnection members, while terrestrial solar cells typically utilize copper wire for interconnects. In some embodiments, the interconnection member can be, for example, a metal plate. Useful metals include, for example, molybdenum; a nickel-cobalt ferrous alloy material designed to be compatible with the thermal expansion characteristics of borosilicate glass such as that available under the trade designation KOVAR from Carpenter Technology Corporation; a nickel iron alloy material having a uniquely low coefficient of thermal expansion available under the trade designation Invar, FeNi36, or 64FeNi; or the like.

A further distinctive difference between space-qualified solar cell arrays and terrestrial solar cell arrays is that a space-qualified solar cell array utilizes welding to provide robust electrical interconnections between the space-qualified solar cells, while terrestrial solar cell arrays can utilize solder for electrical connections. Welding is required in space-qualified solar cell arrays to provide robust electrical connections that can withstand the wide temperature ranges encountered in space. In contrast, solder joints are typically sufficient to survive the rather narrow temperature ranges (e.g., about −40° C. to about +50° C.) encountered with terrestrial solar cell arrays.

Qualification and acceptance testing to ensure that space-qualified solar cells can operate satisfactorily at the wide range of temperatures encountered in space include high-temperature thermal vacuum bake-out and thermal cycling in vacuum (TVAC) or ambient pressure nitrogen atmosphere (APTC). As used herein, the term "space-qualified" shall mean satisfactory operation under exemplary conditions for vacuum bake-out testing that include exposure to a temperature of +100° C. to +135° C. (e.g., about +100° C., +110° C., +120° C., +125° C., +135° C.) for 2 hours to 24 hours, 48 hours, 72 hours, or 96 hours; and exemplary conditions for TVAC and/or APTC testing that include cycling between temperature extremes of −180° C. (e.g., about −180° C., −175° C., −170° C., −165° C., −150° C., −140°, −128° C., −110° C., −100° C., −75° C., or −70° C.) to +145° C. (e.g., about +70° C., +80° C., +90° C., +100° C., +110° C., +120° C., +130° C., +135° C. or +145° C.) for 600 to 32,000 cycles (e.g., about 600, 700, 1500, 2000, 4000, 5000, 7500, 22000, 25000, or 32000 cycles). See, for example, Fatemi et al., "Qualification and Production of Emcore ZTJ Solar Panels for Space Missions," Photovoltaic Specialists Conference (PVSC), 2013 IEEE 39$^{th}$ (DOI: 10.1109/PVSC 2013 6745052).

An additional distinctive difference between space-qualified solar cell arrays and terrestrial solar cell arrays is that in some embodiments space-qualified solar cell arrays utilize an aluminum honeycomb panel for a substrate. In some embodiments, the aluminum honeycomb panel may include a carbon composite face sheet. In some embodiments, the face sheet may have a coefficient of thermal expansion (CTE) that substantially matches the CTE of the Ge layer of the solar cell that is attached to the support. Substantially matching the CTE of the face sheet with the CTE of the Ge layer of the space-qualified solar cell can enable the array to withstand the wide temperature ranges and temperature cycling conditions encountered in space without cracking.

Photovoltaic devices, such as photovoltaic modules or "CIC" (Solar Cell+Interconnects+Cover glass) assemblies, comprise one or more individual solar cells arranged to produce electric power in response to irradiation by solar light. Sometimes, the individual solar cells are rectangular, often square. Photovoltaic modules, arrays and devices including one or more solar cells may also be substantially rectangular, for example, based on an array of individual solar cells. Arrays of substantially circular solar cells are known to involve the drawback of inefficient use of the surface on which the solar cells are mounted, due to space that is not covered by the circular solar cells due to the space that is left between adjacent solar cells due to their circular configuration (cf. U.S. Pat. Nos. 4,235,643 and 4,321,417).

However, solar cells are often produced from circular or substantially circular wafers. For example, solar cells for space applications are typically multi-junction solar cells grown on substantially circular wafers. These circular wafers are sometimes 100 mm or 150 mm diameter wafers. However, as explained above, for assembly into a solar array (henceforth, also referred to as a solar cell assembly), substantially circular solar cells, which can be produced from substantially circular wafers to minimize waste of wafer material and, therefore, minimize solar cell cost, are often not the best option, due to their low array fill factor, which increases the overall cost of the photovoltaic array or panel and implies an inefficient use of available space.

Therefore, the circular wafers are often divided into other form factors to make solar cells. The preferable form factor for a solar cell for space is a rectangle, such as a square, which allows for the area of a rectangular panel consisting of an array of solar cells to be filled 100% (henceforth, that situation is referred to as a "fill factor" of 100%), assuming that there is no space between the adjacent rectangular solar cells. However, when a single circular wafer is divided into a single rectangle, the wafer utilization is low. This results in waste. This is illustrated in FIG. 1, showing how conventionally, out of a circular solar cell wafer 1000 a rectangular solar cell 1001 is obtained, leaving the rest of the wafer as waste 1002. This rectangular solar cell 1001 can then be placed side by side with other rectangular solar cells 1001 obtained from other wafers, thereby providing for efficient use of the surface on which the solar cells are placed (i.e., a high fill factor): a large $W/m^2$ ratio can be obtained, which depending on the substrate may also imply a high W/kg ratio, of great importance for space applications. That is, closely packed solar cells without any space between the adjacent solar cells is generally preferred, and especially for applications in which $W/m^2$ and/or W/kg are important aspects to consider. This includes space applications, such as solar power devices for satellites.

Space applications frequently use high efficiency solar cells, including multi-junction solar cells and/or III/V compound semiconductor solar cells. High efficiency solar cell wafers are often costly to produce. Thus, the waste that has conventionally been accepted in the art as the price to pay for a high fill factor, that is, the waste that is the result of cutting the rectangular solar cell out of the substantially circular solar cell wafer, can imply a considerable cost.

Thus, the option of using substantially circular solar cells, corresponding to substantially circular solar cell wafers, to produce an array or assembly of space-qualified solar cells, could in some cases become an interesting option. There is a trade-off between maximum use of the original wafer material and the fill factor. FIG. 2 shows how circular wafers can be packed according to a layout for maximum use of space, obtaining a fill factor in the order of 90%. This implies that less wafer material is wasted than in the case of the option shown in FIG. 1, but also a less efficient use of the surface on which the solar cells are mounted, due to the lower fill factor. A further problem is that with this kind of layout, the pattern features a hexagonal unit cell 2000 (illustrated with broken lines in FIG. 2), which is non-optimal for producing a rectangular assembly of solar cells. The hexagonal unit cell is inconvenient for producing rectangular arrays of solar cells because the assembly of solar cells will not fit neatly to the edges or boundaries of a rectangular panel.

It is also known to enhance the wafer utilization and to reduce the waste by obtaining an octagonal, instead of rectangular, solar cell from a substantially circular wafer, namely, a rectangular solar cell with cropped corners. However, whereas this approach makes it possible to reduce the waste of wafer material, it is non-optimal from the point of view of the fill factor, as when the rectangular solar cells with cropped corners are placed in rows and columns to form a solar cell array, the space where the cropped corners meet is left without solar cell material and is thus not used for the conversion of light into electric power.

It is possible to reduce the amount of waste and at the same time achieve a high fill factor by dividing a circular or substantially circular wafer not into two single rectangular, such as square, cell, but into a large number of smaller cells. By dividing a circular or substantially circular wafer into a large amount of relatively small cells, such as rectangular cells, most of the wafer material can be used to produce solar cells, and the waste is reduced. For example, a solar cell wafer having a diameter of 100 mm or 150 mm and a surface area in the order of 80 $cm^2$ or 180 $cm^2$ can be used to produce a large amount of small solar cells, such as square or rectangular solar cells each having a surface area of less than 5 $cm^2$, less than 1 $cm^2$, less than 0.1 $cm^2$ or even less than 0.05 $cm^2$ or less than 0.01 $cm^2$. For example, substantially rectangular, such as square, solar cells can be obtained in which the sides are less than 10, 5, 3, 2, 1 or even 0.5 mm long. Thereby, the amount of waste of wafer material can be substantially reduced, and at the same time a high fill factor can be obtained.

However, the use of a large number of relatively small solar cell involves the drawback that for a given effective surface area of the final solar cell assembly, there is an increased number of interconnections between solar cells, in parallel and/or in series, which may render the process of manufacturing the solar cell assembly more complex and/or expensive, and which may also render the entire circuit less reliable, due to the risk for errors due to defective interconnections between individual solar cells.

SUMMARY OF THE DISCLOSURE

A first example of the disclosure relates to a method of preparing a solar cell array for space applications, the method comprising: forming a plurality of III-V compound semiconductor multijunction space-qualified solar cells optimized for operation at AM0 including metallic bonding pads on the top surface thereof, each space-qualified solar cell of the plurality of space-qualified solar cells comprising a front surface, a rear surface, and a first contact in correspondence with the rear surface; forming a polyimide film having a thickness of 1 mil to 4 mils and a conductive layer having a thickness of 1 micrometer to 50 micrometers attached to the polyimide film in an adhesive-less manner to mitigate outgassing, the conductive layer comprising a first conductive section and a second conductive section separated from the first conductive section; forming a conductive bonding material directly adjacent the first conductive section; positioning each space-qualified solar cell of the plurality of space-qualified solar cells directly adjacent the first conductive section, or directly adjacent the conductive bonding material directly adjacent the first conductive section; electrically connecting the first contact of each solar cell of the plurality of solar cells directly, or solely through the conductive bonding material, to the first conductive section so that the plurality of solar cells are connected in parallel through the first conductive section; disposing a ceria doped borosilicate glass supporting member that is 4 mils in thickness on a surface of each of the semiconductor solar cells; and welding interconnects composed of a silver-plated nickel-cobalt ferrous alloy material to the metallic bonding pads on each solar cell, wherein each space-qualified solar cell of the plurality of space-qualified solar cells is a rectangular or substantially square space-qualified solar cell having at least one III-V compound semiconductor layer and having a surface section of less than 1 $cm^2$.

Thereby, manufacturing a space-qualified solar cell assembly comprising a large amount of solar cells becomes easy: the space-qualified solar cells can simply be placed on the first conductive portion, which can make up a substantial part of the surface of the support, such as more than 50%, 70%, 80%, 90%, 95% or more of the total surface of the support, so that the contact or contacts at the rear surface of each solar cell can be easily connected to the first conductive portion of the support, which thus serves to interconnect the solar cells in parallel. The connection between the first contact of each space-qualified solar cell and the first conductive portion of the metal layer of the support can be direct and/or through a conductive bonding material. Thus, this approach is practical for creating space-qualified solar cell assemblies of a large amount of relatively small solar cells, such as solar cells obtained by dividing a solar cell wafer having a substantially circular shape into a large number of individual solar cells having a substantially rectangular shape, for enhanced fill factor and wafer utilization. The first conductive portion is continuous and thus acts as a bus interconnecting the first contacts of the solar cells. In addition, the conductive layer, including the first conductive portion, can act as a thermal sink for the solar cells.

A second example of the disclosure relates to a method of preparing a solar cell assembly designed for space applications, the method comprising: forming a plurality of III-V compound semiconductor multijunction space-qualified solar cells optimized for operation at AM0 including metallic bonding pads on the top surface thereof each solar cell of the plurality of solar cells comprising a front surface, a rear surface, a first contact in correspondence with the rear surface, and a second contact; forming a polyimide film having a thickness of 1 mil to 4 mils and a copper conductive layer having a thickness of 1 micrometer to 50 micrometers attached to the polyimide film in an adhesive-less manner to mitigate outgassing, the conducting layer comprising a first conductive section and a second conductive section separated from the first conductive section; forming at least one groove traversing the conductive layer, the groove comprising a plurality of segments, at least one of said segments extending in parallel with another one of said segments so that the groove electrically isolates the first conductive section and the second conductive section from each other; forming, within the second conductive section, a plurality of substantially elongated sub-portions that extend between sub-portions of the first conductive section, wherein the first conductive section has a larger surface section than the surface section of the second conductive section; forming, at the first contact of each solar cell of the plurality of solar cells, a conductive layer extending over a substantial portion of the rear surface of each solar cell of the plurality of solar cells; placing each solar cell of the plurality of solar cells directly adjacent a conductive bonding material that is directly adjacent the first conductive section, and electrically connected to the first conductive section using the conductive bonding material, wherein the conductive bonding material is selected to enhance heat transfer between each solar cell and the first conductive portion and without an intervening conductor member, with the first contact of each solar cell of the plurality of solar cells electrically connected to the first conductive section so that the plurality of solar cells are connected in parallel through the first conductive section; forming an interconnect connecting the second contact of each solar cell of the plurality of solar cells to the second conductive section to electrically connecting each solar cell of the plurality of solar cells to the second conductive section via the second contact of each solar cell of the plurality of solar cells; disposing a ceria doped borosilicate glass supporting member that is 4 mils in thickness on a surface of each of the semiconductor solar cells; and welding interconnects composed of a silver-plated nickel-cobalt ferrous alloy material to the metallic bonding pads on each solar cell, wherein the plurality of solar cells placed on the first conductive section form a plurality of rows of solar cells, each solar cell of the plurality of solar cells being connected to a sub-portion of the second conductive section extending between two rows of solar cells, and wherein each solar cell of the plurality of solar cells is a substantially rectangular solar cell having at least one III-V compound semiconductor layer and having a surface section of less than 1 cm$^2$.

By means of features such as one or more of the ones listed above, the first and the second conductive portions can be designed for optimized use of the surface of the support, for example, for providing a maximum surface for the placement of space-qualified solar cells, whereby the second conductive portion provides for conductive tracks that can, for example, extend between rows of space-qualified solar cell, so that each track serves for collecting the current produced by, for example, one or two rows of space-qualified solar cells. Thus, the first and the second conductive portions can have sophisticated shapes, including, when viewed from above, extensions of one of said portions entering recesses in the other one, and vice-versa.

In some embodiments of the disclosure, each space qualified solar cell has a surface area of less than 1 cm. The approach of the disclosure can be especially advantageous in the case of relatively small space-qualified solar cells, such as space-qualified solar cells having a surface area of less than 1 cm$^2$, less than 0.1 cm$^2$ or even less than 0.05 cm$^2$ or 0.01 cm$^2$. For example, substantially rectangular, such as square, space-qualified solar cells can be obtained in which the sides are less than 10, 5, 3, 2, 1 or even 0.5 mm long. This makes it possible to obtain rectangular solar cells out of a substantially circular wafer with reduced waste of wafer material, while the approach of the disclosure makes it possible to easily place and interconnect a large number of said space-qualified solar cells in parallel, so that they, in combination, perform as a larger space-qualified solar cell.

In some embodiments of the disclosure, each space-qualified solar cell is bonded to the first conductive portion by a conductive bonding material. Using a conductive bonding material makes it possible to establish the connection between the first contact of each space-qualified solar cell and the support by simply bonding the space-qualified solar cell to the support using the conductive bonding material. The conductive bonding material can be selected to enhance heat transfer between space-qualified solar cell and support.

In some embodiments of the disclosure, the conductive bonding material is an indium alloy. Indium alloys have been found to be useful and advantageous, in that indium can make the bonding material ductile, thereby allowing the use of the bonding material spread over a substantial part of the surface of the support without making the support substantially more rigid and reducing the risk of formation of cracks when the assembly is subjected to bending forces. Preferably, support, space-qualified solar cells and bonding material are matched to each other to feature, for example, similar thermal expansion characteristics. On the other hand, the use of a metal alloy, such as an indium alloy, is advantageous over other bonding material such as polymeric adhesives in that it allows for efficient heat dissipation into the underlying conductive layer, such as for example a copper layer. In some embodiments of the disclosure, the bonding material is indium lead.

In some embodiments of the disclosure, the conductive layer comprises copper.

In some embodiments of the disclosure, the support comprises a Kapton® film, the conductive layer being placed on the Kapton® film. The option of using a Kapton® film for the support is practical for, for example, space applications.

In some embodiments of the disclosure, the first contact of each space-qualified solar cell comprises a conductive, such as a metal, layer extending over a substantial portion of the rear surface of the respective space-qualified solar cell, preferably over more than 50% of the rear surface of the respective space-qualified solar cell, more preferably over more than 90% of the rear surface of the respective space-qualified solar cell. In some embodiments of the disclosure, the first contact comprises a conductive, such as a metal, layer covering the entire rear surface of the space-qualified solar cell. This helps to establish a good and reliable contact with the first conductive portion of the conductive layer of the support.

In some embodiments of the disclosure, each space-qualified solar cell comprises at least one III-V compound semiconductor layer. As indicated above, high wafer utilization can be especially advantageous when the space-qualified solar cells are high efficiency space-qualified solar cells such as III-V compound semiconductor space-qualified solar cells, often implying the use of relatively expensive wafer material.

In some embodiments of the disclosure, the solar cell array for space applications assembly has a substantially rectangular shape and a surface area in the range of 25-400 cm$^2$.

Another aspect of the disclosure relates to a solar cell array for space applications comprising a plurality of solar cell arrays for space application, each of these solar cell arrays for space application comprising a solar cell assembly according to the first aspect of the disclosure. As indicated above, the solar cell arrays for space applications can advantageously serve as sub-assemblies which can be interconnected to form a major solar cell array for space applications, comprising, for example, an array of such solar cell arrays for space applications comprising a plurality of strings of such solar cell arrays for space applications, each string comprising a plurality of solar cell arrays for space applications connected in series. Thus, a modular approach can be used for the manufacture of relatively large solar cell arrays for space applications out of small space-qualified solar cells, which are assembled to form arrays as described above, where after the arrays are interconnected to form a larger array.

BRIEF DESCRIPTION OF THE DRAWINGS

To complete the description and in order to provide for a better understanding of the disclosure, a set of drawings is provided. Said drawings form an integral part of the description and illustrate embodiments of the disclosure, which should not be interpreted as restricting the scope of the disclosure, but just as examples of how the disclosure can be carried out. The drawings comprise the following figures.

DETAILED DESCRIPTION

The present disclosure provides a process for the design and fabrication of a solar cell array panel for space application utilizing interconnected modular subassemblies. Although principally concerned with the structure and organization of the modular subassemblies, the solar cells are essential components of such subassemblies, and thus a discussion of III-V compound semiconductor solar cells is in order here.

Figure 1:
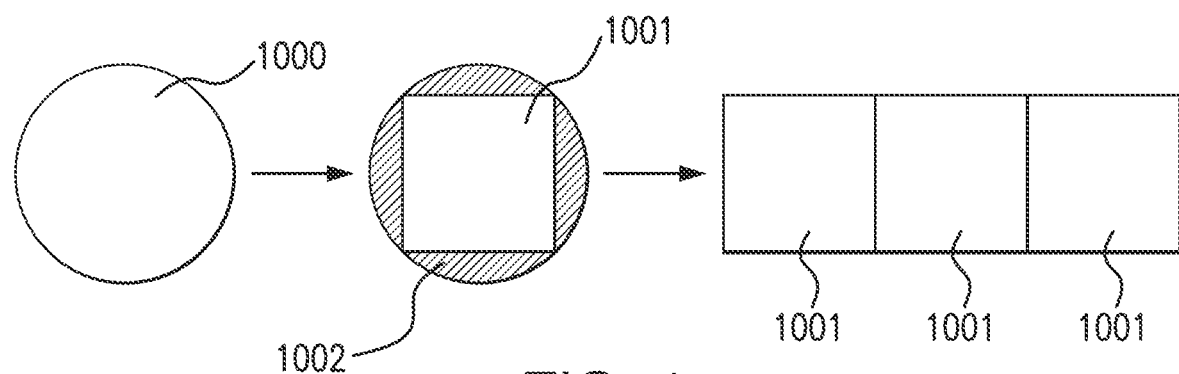
FIG. 1 schematically illustrates a prior art arrangement for producing a closely packed solar cell array out of square space-qualified solar cells obtained from a circular solar cell wafer.
Figure 2:
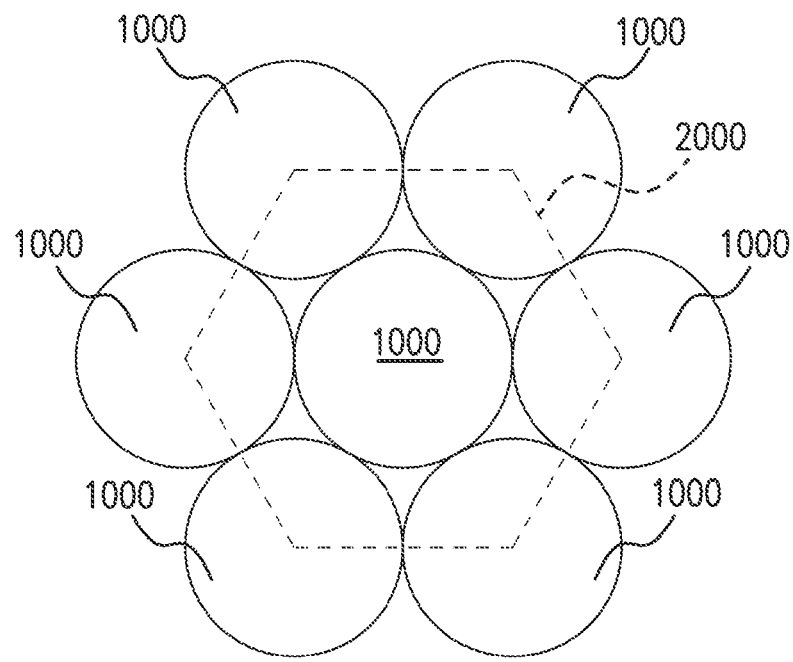
FIG. 2 schematically illustrates how circular solar cells packed to obtain a maximum fill factor imply a hexagonal unit cell for the arrangement of space-qualified solar cells in an array of space-qualified solar cells, or a space-qualified solar cell assembly.
Figure 3:
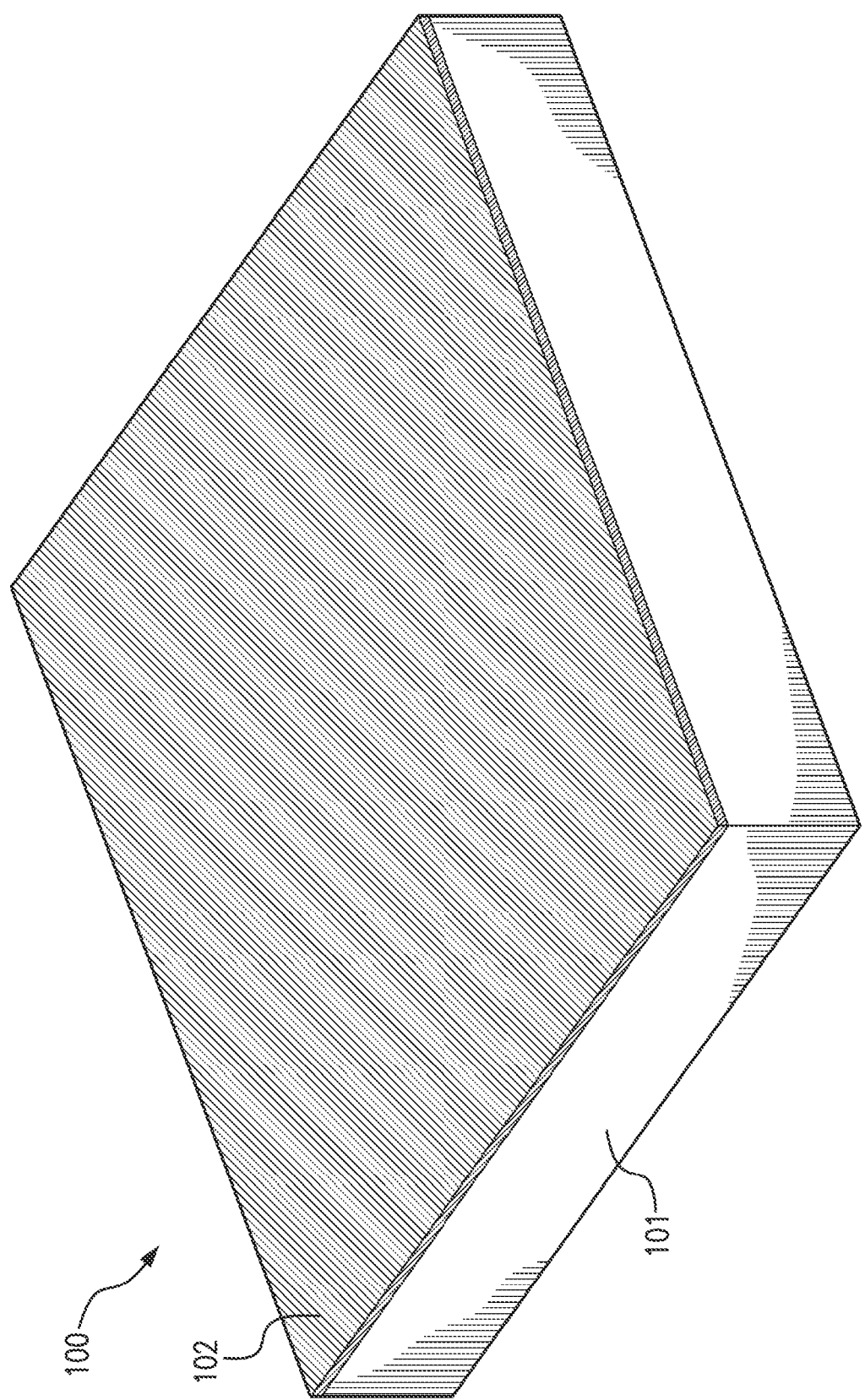
FIG. 3 is a perspective view of a support that can be used when caring out some of the embodiments of the disclosure.

FIG. 3 illustrates an example of a support that can be used in an embodiment of the disclosure. The support comprises an insulating support layer 101 and a conductive metal layer 102 arranged on a top surface of the support layer 101. In some embodiments of the disclosure, the metal layer 102 is a copper layer, having a thickness in the range of from 1 μm and up to 50 μm. In some embodiments of the disclosure, the support layer 101 is a Kapton® layer, that is, a polyimide film layer. Preferably the metal layer is attached to the support layer in an adhesive-less manner, to limit outgassing when used in a space environment. In some embodiments of the disclosure the support layer can have a thickness in the range of 1 mil (25.4 μm) to 4 mil (101.6 μm), In some embodiments of the disclosure, a support can be provided comprising Kapton®, or another suitable support material, on both sides of the metal film 102, with cut-outs for the attachment of solar cells and interconnects to the metal film.

Figure 4:
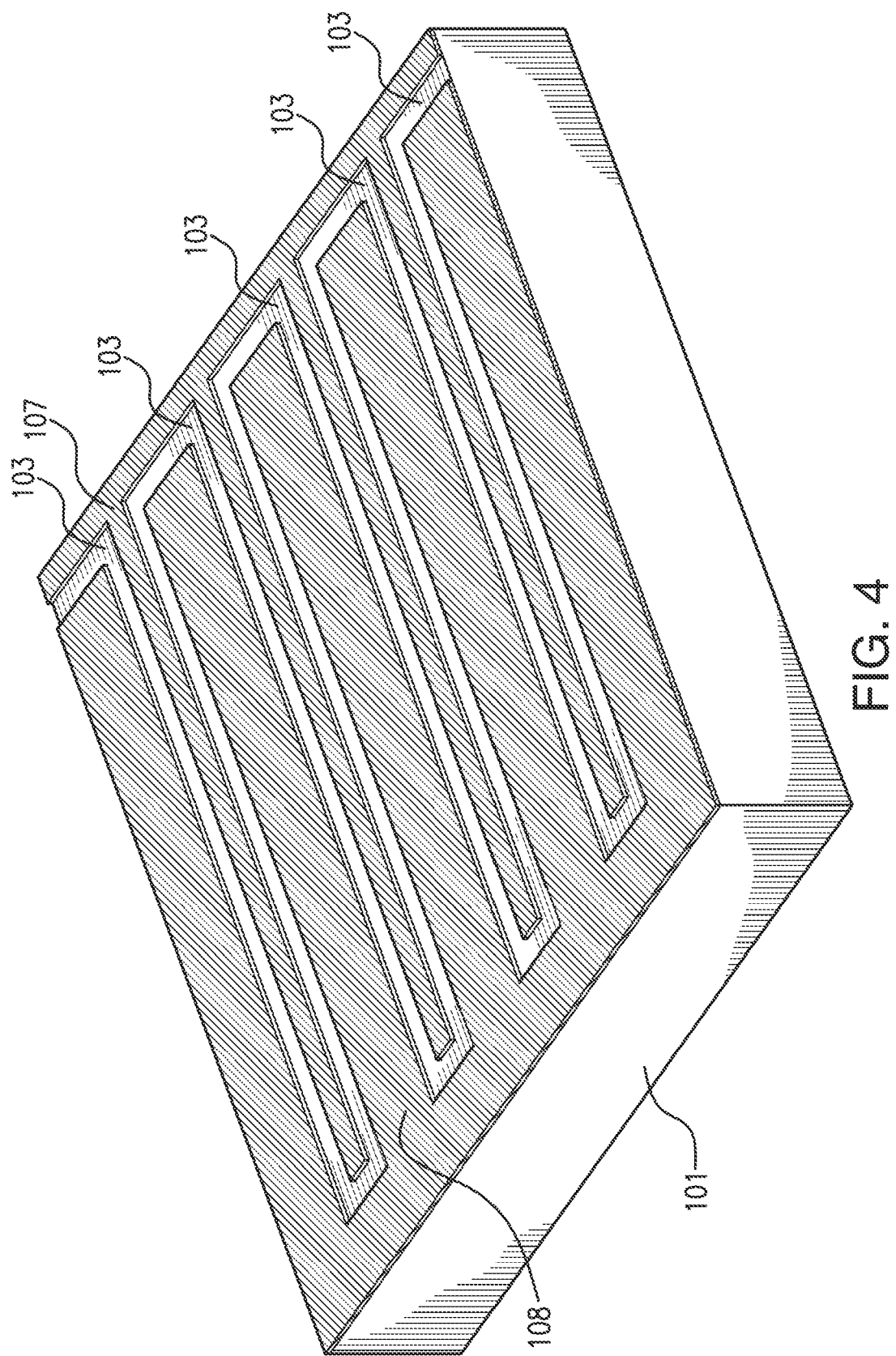
FIG. 4 is a perspective view of the support after a step of cutting a meandering groove traversing a top metal layer of the support.

FIG. 4 illustrates the support 100 of FIG. 3 after a step in which part of the metal layer 102 has been removed, by for example etching or laser scribing, whereby a channel or groove 103 is formed traversing the metal layer, separating it into a first conductive portion 108 and a second conductive portion 107. It can be observed how the two portions are nested with each other: the groove 103 follows a meandering path, whereby the first conductive portion 108 features a set of substantially parallel strips connected to each other at one end thereof. The second conductive portion 107 also comprises a set of strips, extending partly in parallel with the strips of the first conductive portion, between adjacent strips of said first conductive portion. It can be seen how the first conductive portion 108 and the second conductive portion 107 are electrically isolated from each other due to the presence of the groove, which traverses the metal layer from a top surface thereof down to the support layer 101.

Figure 5A:
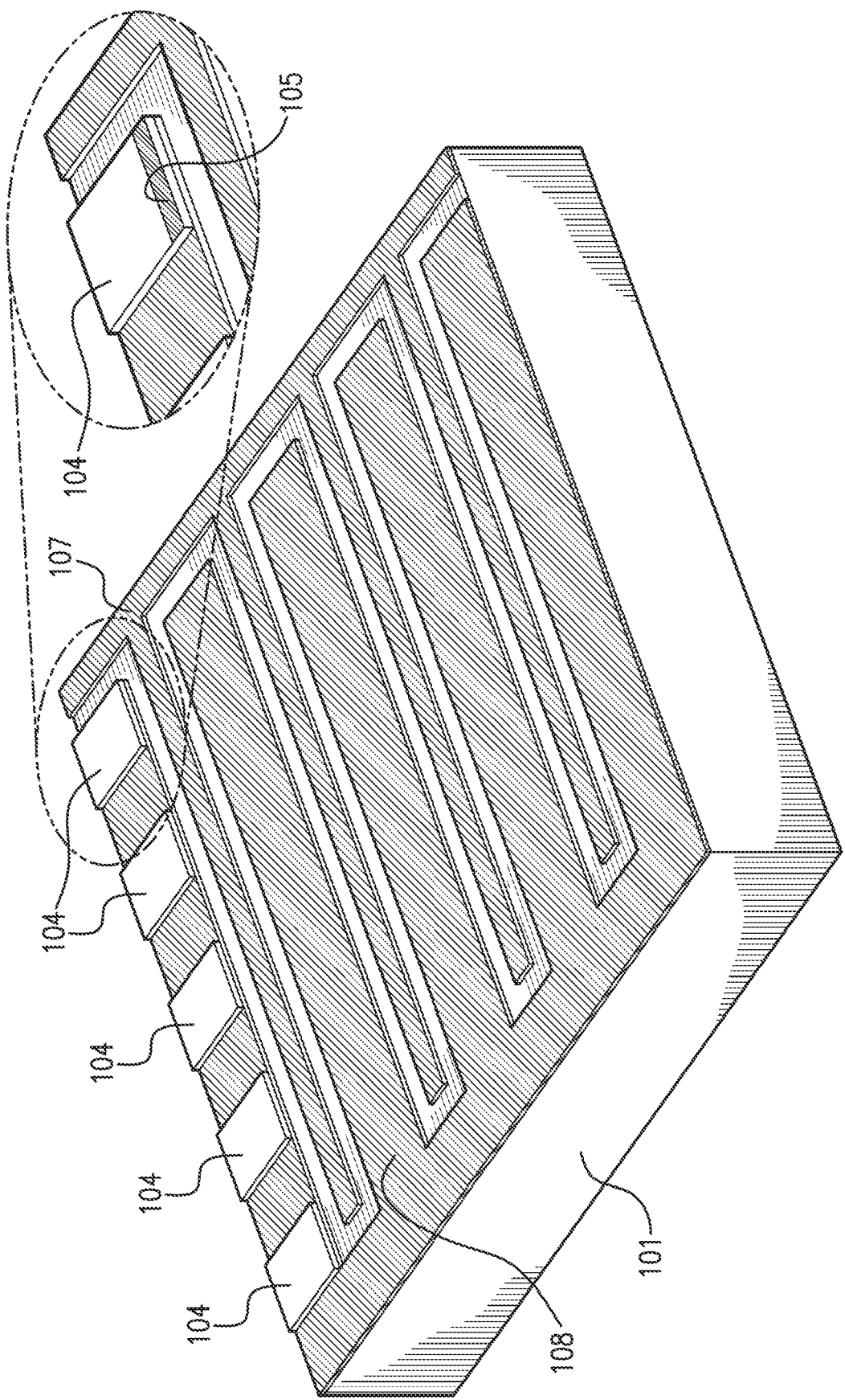
FIGS. 5A-5D schematically illustrate a series of steps of a process for manufacturing a solar cell assembly using the support of FIG. 4.
Figure 7:
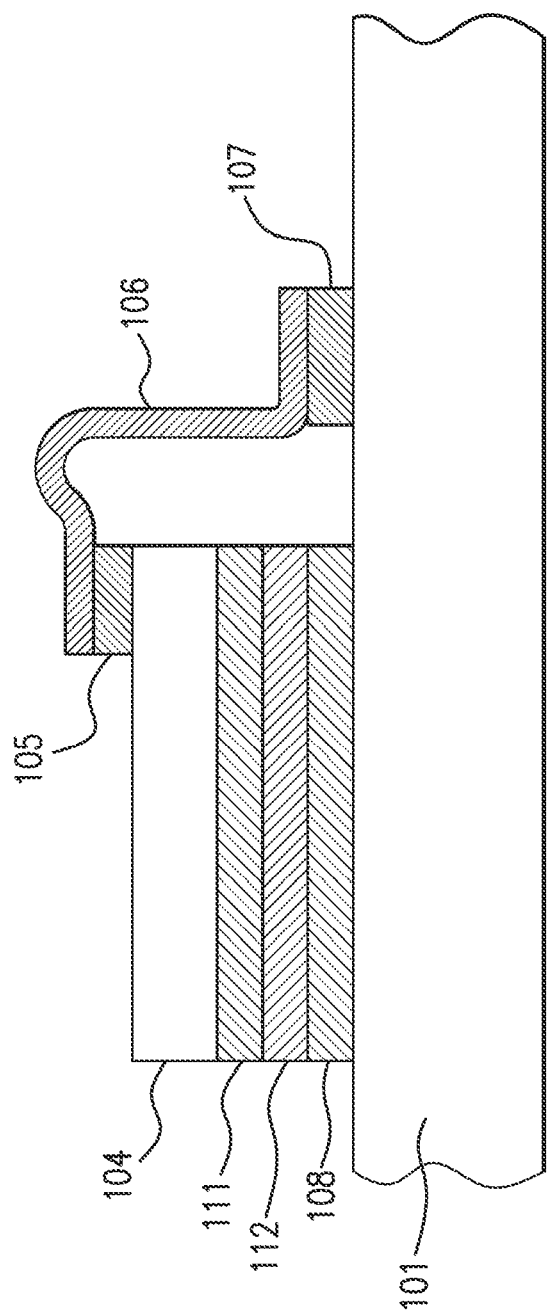
FIG. 7 is a schematic cross-sectional view of a portion of a solar cell assembly for space application as per FIG. 5D

FIG. 5A schematically illustrates how a plurality of solar cells 104 have been attached to the first conductive portion 108. Only five of these solar cells 104 are shown in FIG. 5A for simplicity, and in FIG. 5A the solar cells 104 have been illustrated substantially spaced from each other. However, in practice solar cells 104 are preferably placed close to each other and all throughout the first conductive portion, so as to optimize space utilization: it is preferred that a substantial percentage, such as more than 50%, 60%, 70%, 80% or 90%, such as more than 95%, of the surface of the support 101 is covered by solar cells, so as to provide for an optimized W/m$^2$ or W/kg ratio. Each solar cell comprises a first contact 111 on a rear or bottom surface of the solar cell, as shown in FIG. 7, and a second contact 105 on a front or top surface of the solar cell. In some embodiments of the disclosure, the first contact 111 comprises a metal layer covering the entire rear surface of the solar cell or a substantial portion of the rear surface of the solar cell, and the second contact 105 is placed adjacent to an edge of the front surface of the solar cell 104. The second contact 105 has preferably a small surface area to allow the major part of the front surface of the solar cell to be an effective surface for the conversion of sunlight into electric power. In FIG. 5A, the second contact 105 is only shown for one of the solar cells, for simplicity.

The solar cell 104 is preferably attached to the first conductive portion 108 by a conductive bonding material 112 as shown in FIG. 7, such as a layer of a metal alloy, such as an indium alloy, such as an indium lead alloy. As is easily understood from FIG. 5B and FIG. 7, the metal layer including the first conductive portion 108 serves as a heat sink for the solar cells, and an indium alloy such as indium lead has appropriate heat conduction characteristics. At the same time, indium is advantageous as it provides for ductility, thereby reducing the risk for cracks in the bonds between the solar cells and the first conductive portion 108 when the assembly is subjected to bending forces.

Figure 5B:
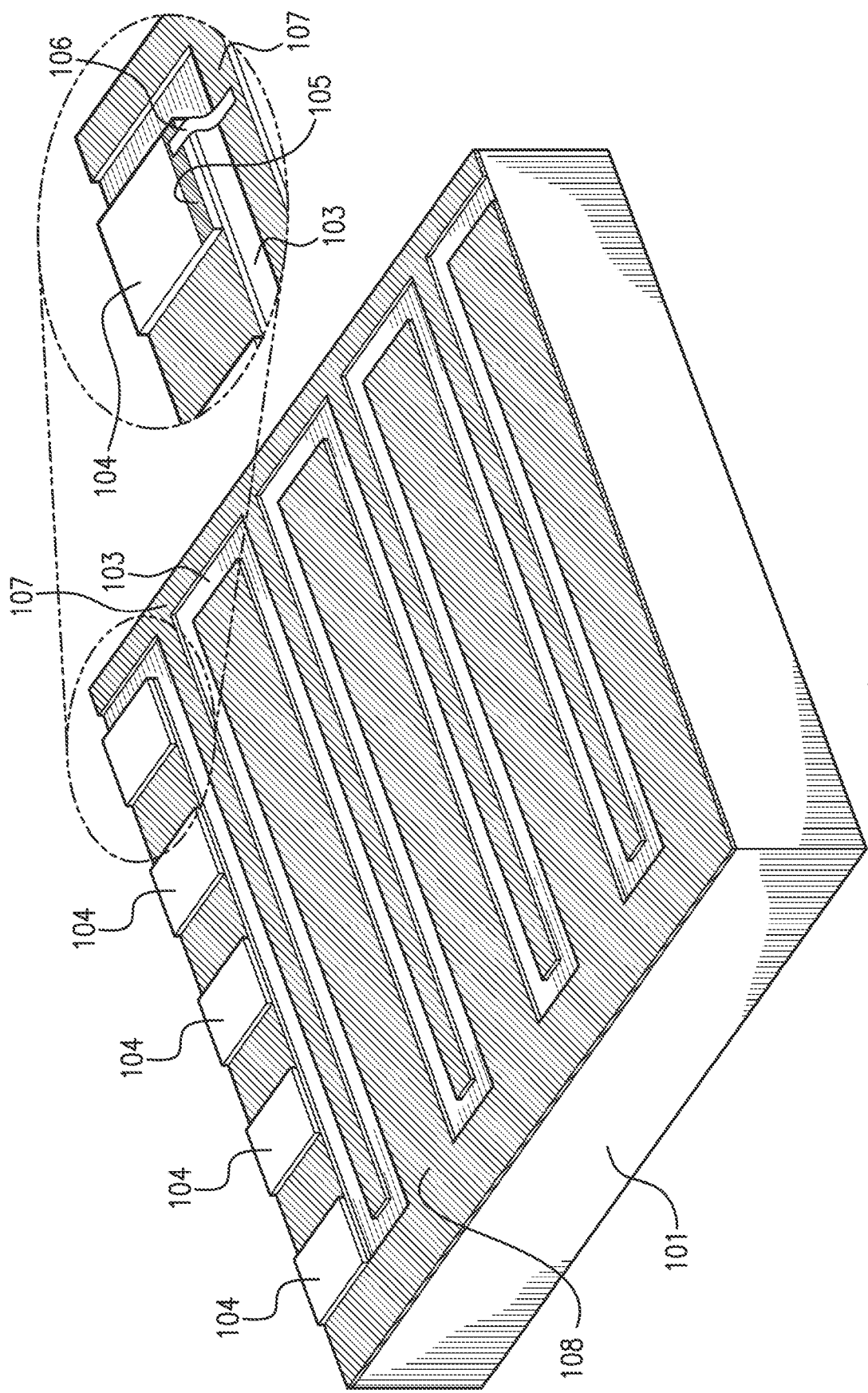

FIG. 5B shows the result of a further step of the process, in which the second contact 105 of each solar cell has been connected to the second conductive portion 107 by a connecting member or interconnect 106 (only one of these interconnects 106 is shown in FIG. 5B, for simplicity).

Figure 5C:
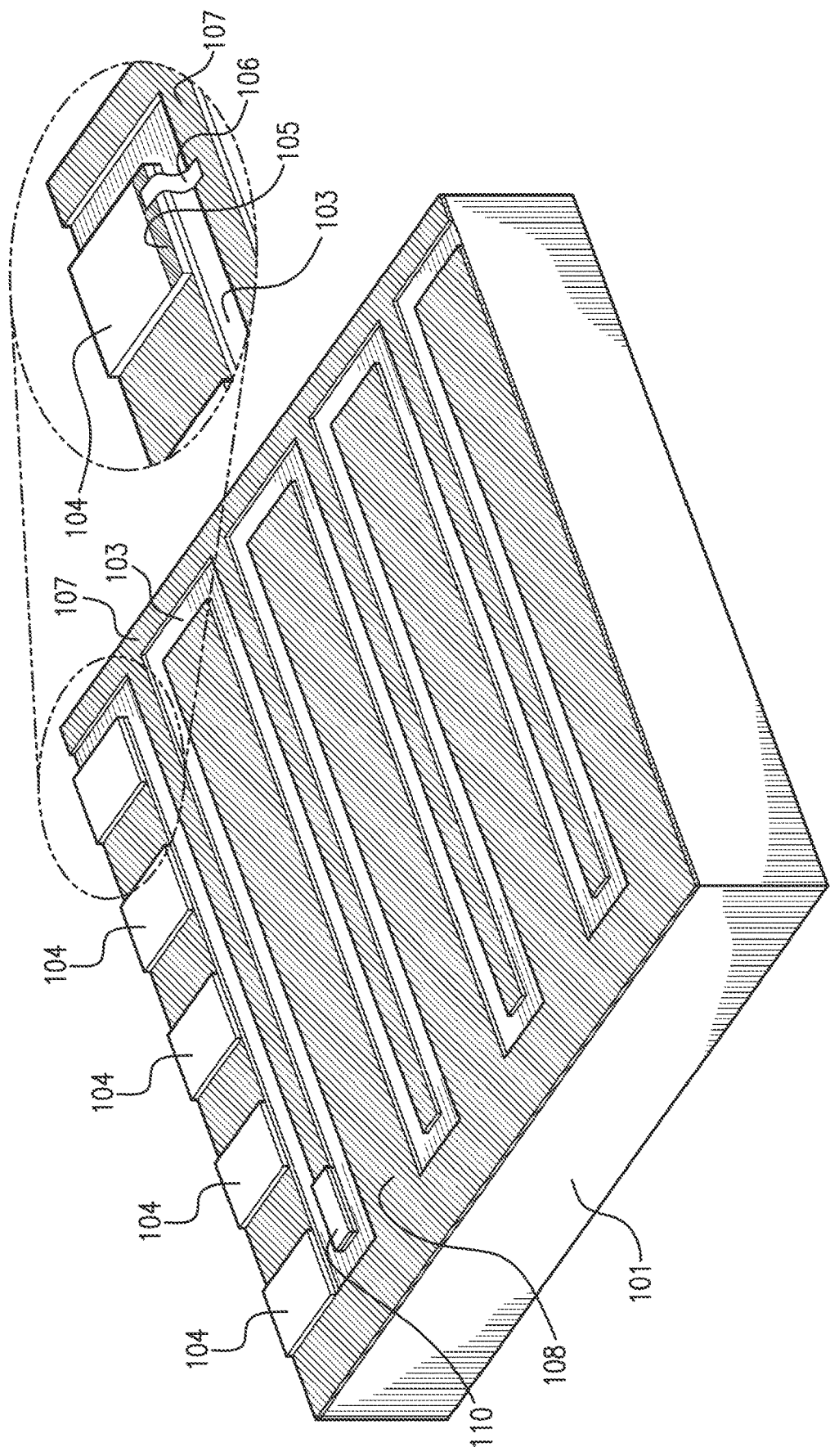

FIG. 5C illustrates the solar cell assembly after the next process step, in which a bypass diode 110 has been attached to the second conductive portion at a free end of one of the strips. The diode has a rear terminal which is connected to the second conductive portion 107, for example, by means of an indium alloy.

Figure 5D:
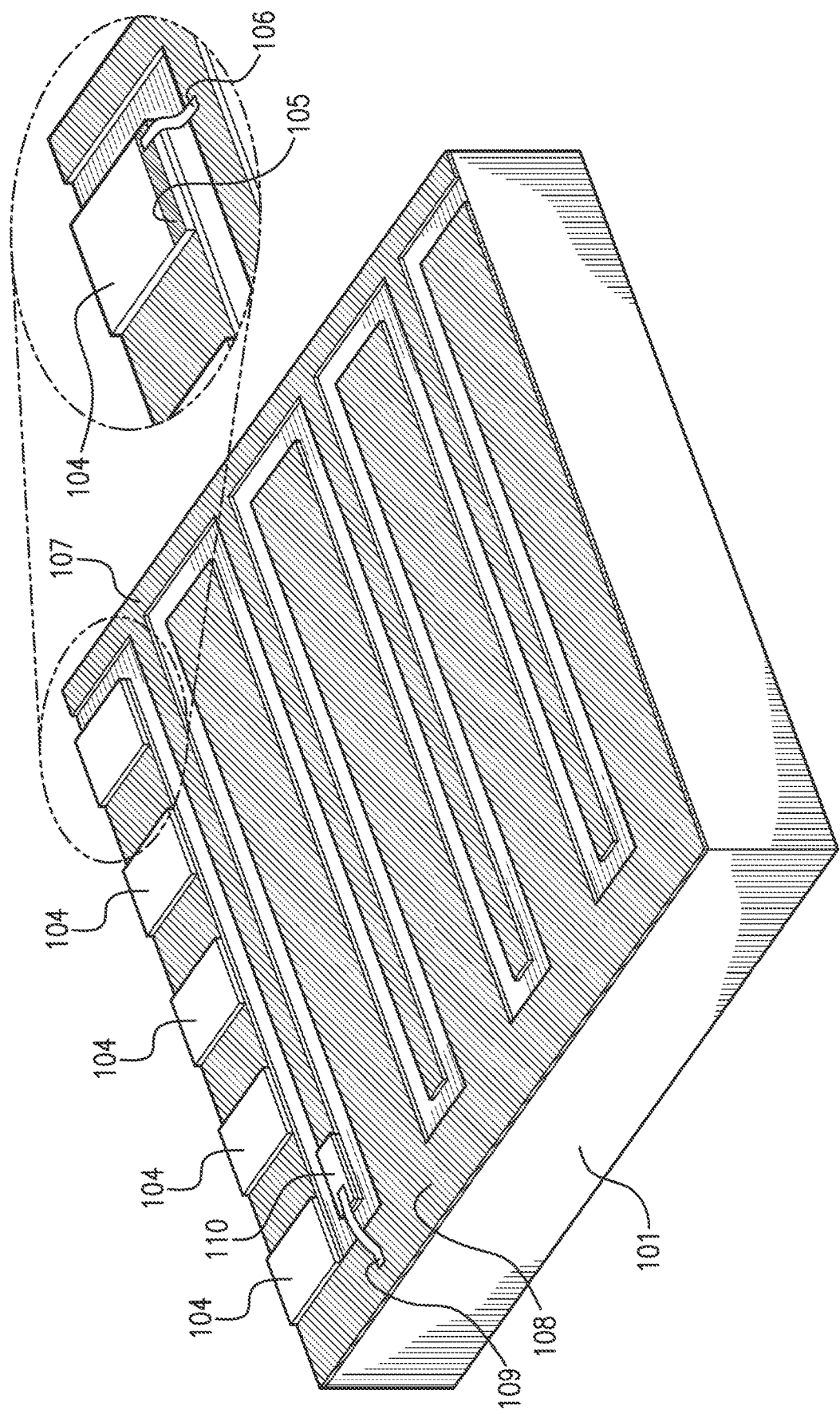

FIG. 5D illustrates the solar cell assembly after the next process step in which a bypass diode interconnect 109 is attached to electrically connect a top terminal of the bypass diode 110 with the first conductive portion 108.

Figure 5E:
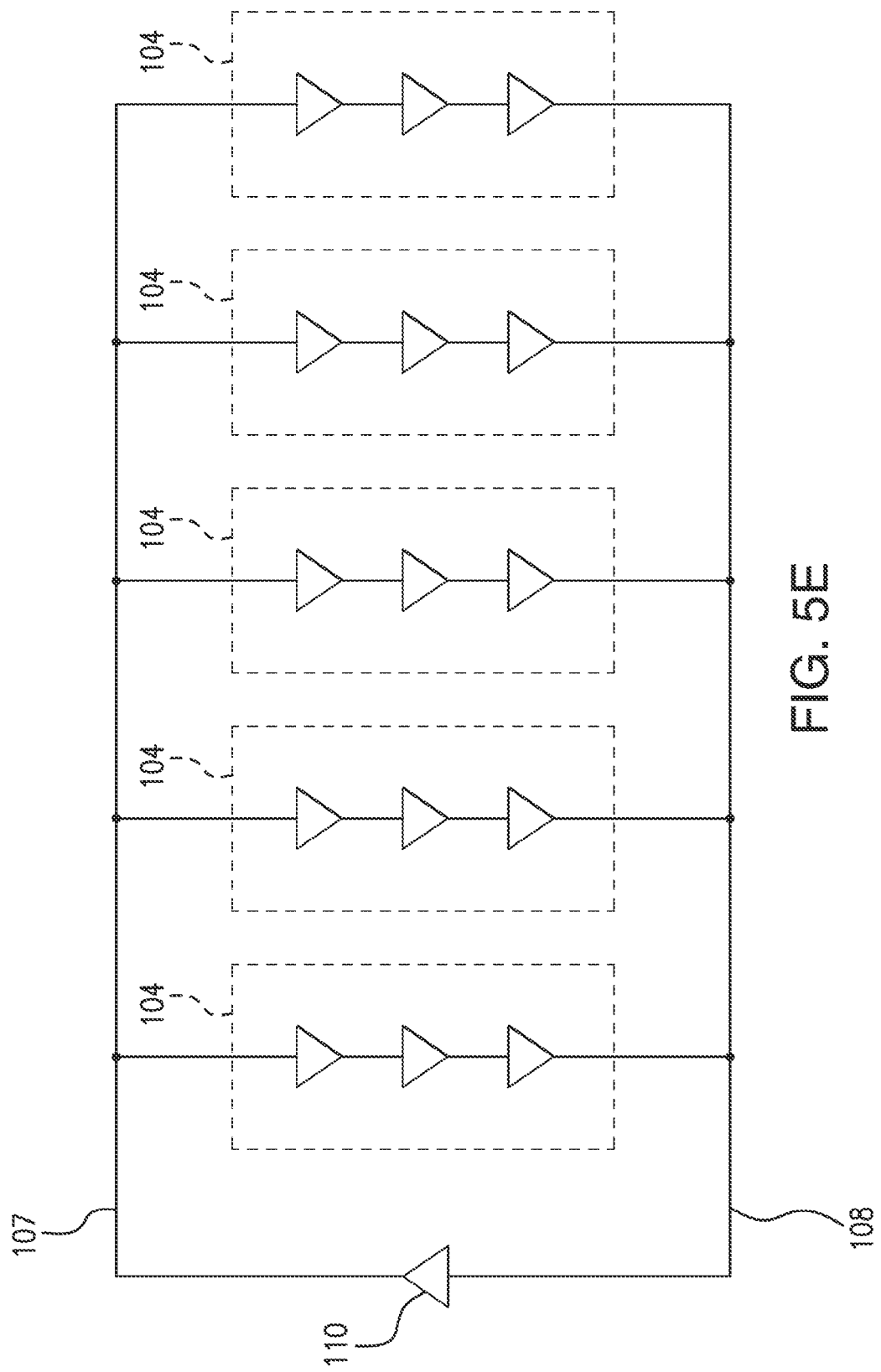
FIG. 5E is a circuit diagram of the solar cell assembly of FIG. 5D.

FIG. 5E is a circuit diagram of the assembly shown in FIG. 5D, in which five solar cells 104 are connected in parallel between two bus bars 107 and 108, corresponding to the second and to the first conductive portions, respectively, and with a bypass diode 110 common to the five solar cells. Each solar cell is a multijunction solar cell.

It is clear from the embodiment schematically shown in FIGS. 5A-5D how many small solar cells, such as solar cells having a surface area of less than 1 cm$^2$, less than 0.1 cm$^2$ or less than 0.01 cm$^2$, can easily be placed on the first conductive portion 108 such as on different subareas, tracks or strips of the first conductive portion, and bonded to it by bonding their back sides to the first conductive portion using a conductive bond that connects that first or rear contact of the solar cell to the first conductive portion 108, and how interconnects can be added to connect the second or upper contacts of the solar cells to the second conductive portion 107. One or more bypass diodes can easily be added, as shown.

Thus, an assembly of a plurality of space-qualified solar cells connected in parallel is obtained, and this kind of assembly can be used as a subassembly, together with more subassemblies of the same kind, to form a larger assembly including strings of series connected subassemblies.

Figure 6A:
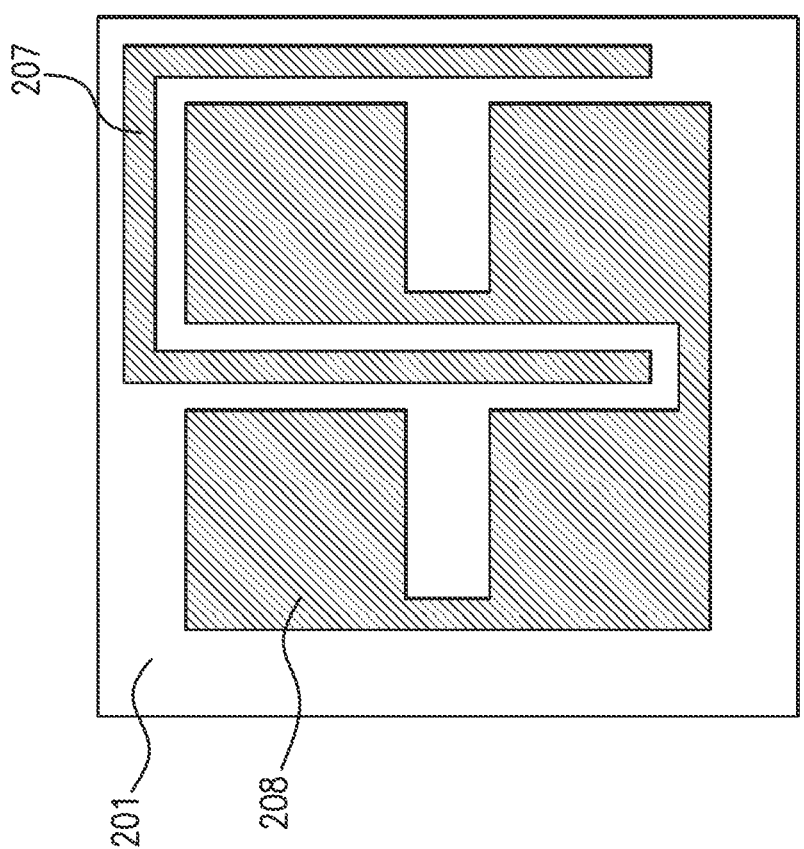
FIGS. 6A-6E schematically illustrate a series of steps of a process for manufacturing a solar cell assembly for space application in accordance with another embodiment of the disclosure.
Figure 6B:
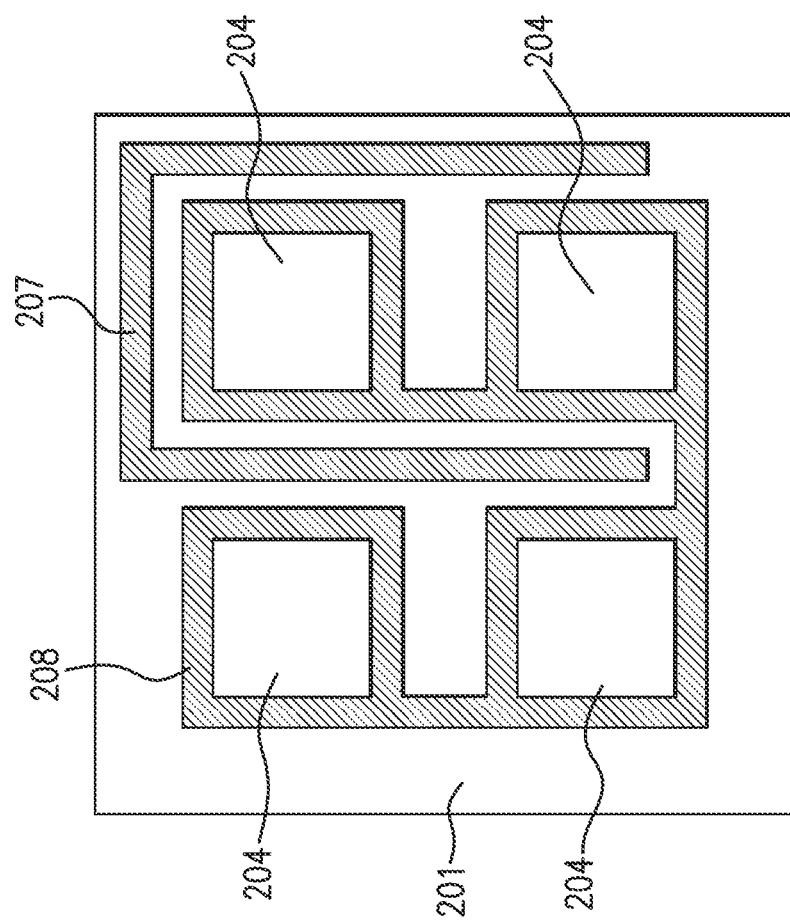
Figure 6C:
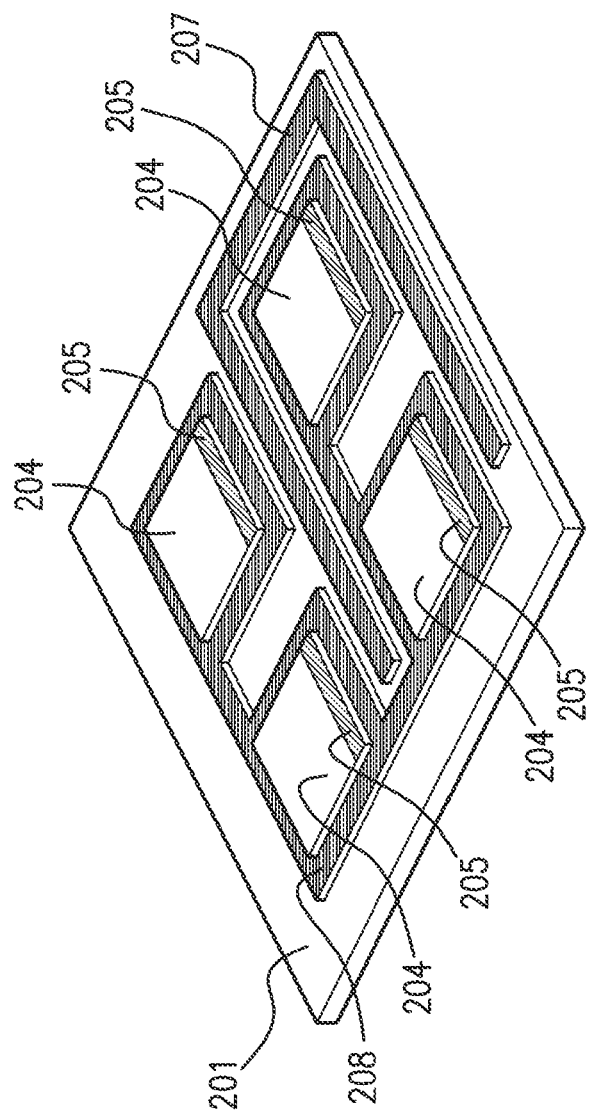
Figure 6D:
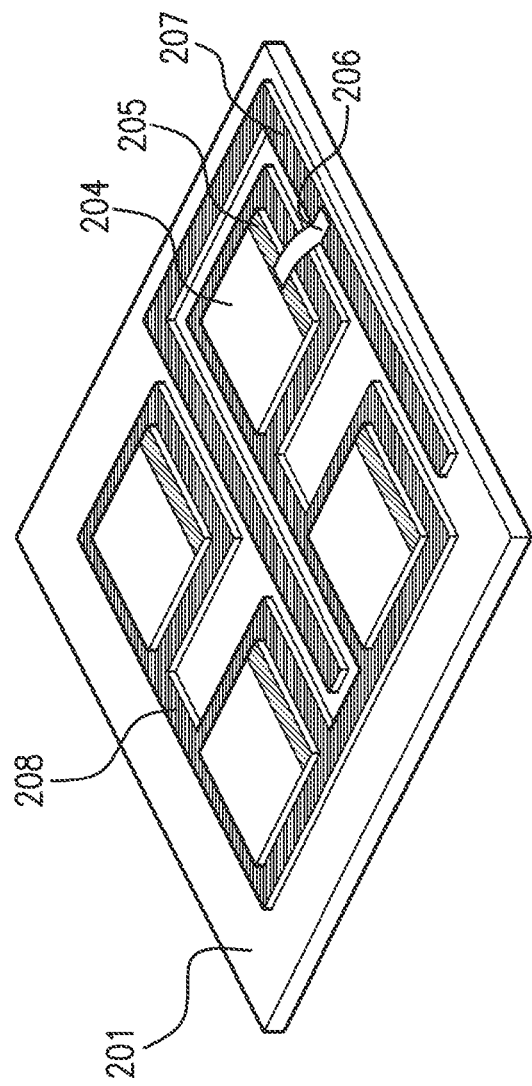
Figure 6E:
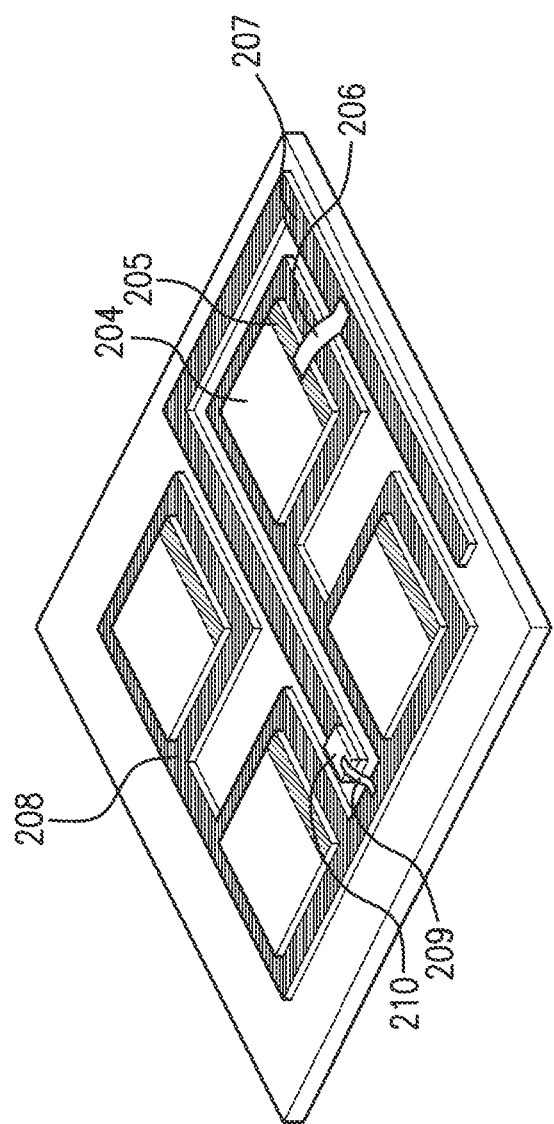

FIGS. 6A-6E schematically illustrate the different stages of a process in accordance with another embodiment of the disclosure. In FIG. 6A the substrate is shown after elimination of part of the metal layer, so that the substrate layer 201, such as a Kapton layer, is covered by a first conductive portion 208 and a second conductive portion 207. The second conductive portion 207 comprises three segments following a meandering path or a portion of a meandering path, and the first conductive portion 208 comprises four major, substantially square, portions interconnected by three shorts strips. In FIG. 6B, one substantially rectangular solar cell has been placed on each of the square portions of the first conductive portion 208. FIG. 6C is a perspective view in which the second contacts 205 of the solar cells 204 can be observed. FIG. 6D schematically illustrates how an interconnect 206 has been added to connect the second contact 205 of one of the solar cells 204 to the second conductive portion or busbar 207 (only one such interconnect is shown in the drawing, for simplicity). In FIG. 6E, a bypass diode 210 and its interconnect have been added to interconnect the first conductive portion and the second conductive portion.

Just as in the case of FIGS. 5A-5D, also FIGS. 6A-6E are only intended to schematically show an embodiment of the disclosure. In practice, the spatial distribution will mostly differ: solar cells are to be packed relatively close to each other and arranged to occupy most of the surface of the assembly, so as to contribute to an efficient space utilization from a W/M perspective.

FIG. 7 schematically illustrates layers of a cross-section of a portion of the assembly of the embodiment of FIG. 5D. A Kapton® support layer 101 supports copper strips 108 and 107, and a solar cell 104 having a bottom metal layer 111 forming a first contact is bonded to the copper strip 108 by an indium alloy layer 12. A second contact 105 at the upper surface of the solar cell 104 is connected to the copper strip 107 by the interconnect 106.

Thus, a method of preparing a solar cell array for space applications is described. For example, a method of preparing a solar cell array for space applications comprises: forming a plurality of III-V compound semiconductor multijunction space-qualified solar cells optimized for operation at AM0 including metallic bonding pads on the top surface thereof, each space-qualified solar cell of the plurality of space-qualified solar cells comprising a front surface, a rear surface, and a first contact in correspondence with the rear surface; forming a polyimide film having a thickness of 1 mil to 4 mils and a conductive layer having a thickness of 1 micrometer to 50 micrometers attached to the polyimide film in an adhesive-less manner to mitigate outgassing, the conductive layer comprising a first conductive section and a second conductive section separated from the first conductive section; forming a conductive bonding material directly adjacent the first conductive section; positioning each space-qualified solar cell of the plurality of space-qualified solar cells directly adjacent the first conductive section, or directly adjacent the conductive bonding material directly adjacent the first conductive section; electrically connecting the first contact of each solar cell of the plurality of solar cells directly, or solely through the conductive bonding material, to the first conductive section so that the plurality of solar cells are connected in parallel through the first conductive section; disposing a ceria doped borosilicate glass supporting member that is 4 mils in thickness on a surface of each of the semiconductor solar cells; and welding interconnects composed of a silver-plated nickel-cobalt ferrous alloy material to the metallic bonding pads on each solar cell, wherein each space-qualified solar cell of the plurality of space-qualified solar cells is a rectangular or substantially square space-qualified solar cell having at least one III-V compound semiconductor layer and having a surface section of less than 1 cm.

In another example, a method of preparing a solar cell assembly designed for space applications comprises: forming a plurality of III-V compound semiconductor multijunction space-qualified solar cells optimized for operation at AM0 including metallic bonding pads on the top surface thereof each solar cell, of the plurality of solar cells comprising a front surface, a rear surface, a first contact in correspondence with the rear surface, and a second contact; forming a polyimide film having a thickness of 1 mil to 4 mils and a copper conductive layer having a thickness of 1 micrometer to 50 micrometers attached to the polyimide film in an adhesive-less manner to mitigate outgassing, the conducting layer comprising a first conductive section and a second conductive section separated from the first conductive section; forming at least one groove traversing the conductive layer, the groove comprising a plurality of segments, at least one of said segments extending in parallel with another one of said segments so that the groove electrically isolates the first conductive section and the second conductive section from each other; forming, within the second conductive section, a plurality of substantially elongated sub-portions that extend between sub-portions of the first conductive section, wherein the first conductive section has a larger surface section than the surface section of the second conductive section; forming, at the first contact of each solar cell of the plurality of solar cells, a conductive layer extending over a substantial portion of the rear surface of each solar cell of the plurality of solar cells; placing each solar cell of the plurality of solar cells directly adjacent a conductive bonding material that is directly adjacent the first conductive section, and electrically connected to the first conductive section using the conductive bonding material, wherein the conductive bonding material is selected to enhance heat transfer between each solar cell and the first conductive portion and without an intervening conductor member, with the first contact of each solar cell of the plurality of solar cells electrically connected to the first conductive section so that the plurality of solar cells are connected in parallel through the first conductive section; forming an interconnect connecting the second contact of each solar cell of the plurality of solar cells to the second conductive section to electrically connecting each solar cell of the plurality of solar cells to the second conductive section via the second contact of each solar cell of the plurality of solar cells; disposing a ceria doped borosilicate glass supporting member that is 4 mils in thickness on a surface of each of the semiconductor solar cells; and welding interconnects composed of a silver-plated nickel-cobalt ferrous alloy material to the metallic bonding pads on each solar cell, wherein the plurality of solar cells placed on the first conductive section form a plurality of rows of solar cells, each solar cell of the plurality of solar cells being connected to a sub-portion of the second conductive section extending between two rows of solar cells, and wherein each solar cell of the plurality of solar cells is a substantially rectangular solar cell having at least one III-V compound semiconductor layer and having a surface section of less than 1 cm$^2$.

It is to be noted that the terms "front", "back", "top", "bottom", "over", "on", "under", and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Furthermore, those skilled in the art will recognize that boundaries between the above described operations are merely illustrative. The multiple units/operations may be combined into a single unit/operation, a single unit/operation may be distributed in additional units/operations, and units/operations may be operated at least partially overlapping in time. Moreover, alternative embodiments may include multiple instances of a particular unit/operation, and the order of operations may be altered in various other embodiments.

In the claims, the word 'comprising' or 'having' does not exclude the presence of other elements or steps than those listed in a claim. The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an," The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The present disclosure can be embodied in various ways. The above described orders of the steps for the methods are only intended to be illustrative, and the steps of the methods of the present disclosure are not limited to the above specifically described orders unless otherwise specifically stated. Note that the embodiments of the present disclosure can be freely combined with each other without departing from the spirit and scope of the disclosure.

Although some specific embodiments of the present disclosure have been demonstrated in detail with examples, it should be understood by a person skilled in the art that the above examples are only intended to be illustrative but not to limit the scope of the present disclosure. It should be understood that the above embodiments can be modified without departing from the scope and spirit of the present disclosure which are to be defined by the attached claims.

The invention claimed is:

1. A solar cell module comprising:
   a plurality of III-V compound semiconductor multijunction solar cells, each solar cell of the plurality of solar cells comprising a front surface, a rear surface, a first metal contact in correspondence with the rear surface and forming a contact of a first polarity type to the solar cell, and a metallic bonding pad on the front surface of the solar cell forming a contact of a second plurality type to the solar cell;
   a planar support;
   a conductive layer disposed on an upper surface of the planar support, the conductive layer comprising a first conductive section and a second conductive section, each section being electrically isolated from each other by at least one groove traversing the conductive layer, wherein the second conductive section comprises a plurality of substantially elongated sub-portions at least some of which extend between sub-portions of the first conductive section, wherein each of the solar cells is disposed over the first conductive section but not over the second conductive section;

each first metal contact of each solar cell of the plurality of the solar cells being conductively bonded to the first conductive section such that the first metal contact of each solar cell of the plurality of solar cells is electrically connected to the first conductive section; and a plurality of discrete electrical interconnects, each discrete electrical interconnect coupling the metallic bonding pad on a respective solar cell to a respective portion of the second conductive section of the conductive layer.

2. A module as defined in claim, 1, wherein the second conductive section comprises a plurality of substantially elongated sub-portions at least some of which extend between sub-portions of the first conductive section.

3. A module as defined in claim 1, further comprising a bypass diode coupled between the first conductive section and the second conductive section.

4. A module as defined in claim 3, wherein the bypass diode comprises a top side terminal and a rear side terminal, the bypass diode being placed on the second conductive section with said rear side terminal of the bypass diode being electrically coupled to the second conductive section, the top side terminal of the bypass diode being electrically coupled to the first conductive section.

5. A module as defined in claim 3, wherein the bypass diode comprises a top side terminal and rear side terminal, the bypass diode being placed on the first conductive section with the rear side terminal of the bypass diode electrically coupled to the first conductive section, the top side terminal of the bypass diode being electrically coupled to the second conductive section.

6. A module as defined in claim 1, wherein the plurality of solar cells are electrically connected in parallel, and each solar cell of the plurality of solar cells is rectangular or substantially square.

7. A module as defined in claim 1, wherein the at least one groove follows a path consisting of a plurality of segments arranged one after the other, starting with a first segment and ending with a final segment, each segment after the first segment extending at a right angle with respect to an immediately preceding segment, wherein each of the segments of the at least one groove has sidewalls that are straight in a direction of the path.

8. A module as defined in claim 1, wherein at least one of said segments extends in parallel with another one of said segments.

9. A module as defined in claim 1, wherein at least one portion of the at least one groove follows a substantially meandering path.

10. A module as defined in claim 1, wherein a total surface area of the first conductive section that faces away from the planar support is larger than a total surface area of the second conductive section that faces away from the planar support.

11. A module as defined in claim 1, wherein the plurality of solar cells placed on the first conductive section form a plurality of rows of solar cells, each solar cell of the plurality of solar cells being connected to a sub-portion of the second conductive section extending between two rows of solar cells.

12. A module as defined in claim 1, wherein each first metal contact is conductively bonded by an indium alloy.

13. A module as defined in claim 12, wherein the indium alloy is indium lead.

14. A module as defined in claim 1, wherein the planar support is a polyimide film and the conductive layer comprises copper.

15. A module as defined in claim 1, wherein the first metal contact of each solar cell of the plurality of solar cells comprises a conductive layer extending over a substantial portion of the rear surface of each solar cell of the plurality of solar cells.

16. A module as defined in claim 1, wherein the support comprises a first terminal of the first polarity type on the top surface thereof coupled to the first conductive section, and a second terminal of the second plurality type on the top surface thereof coupled to the second conductive section.

17. A module as defined in claim 1, wherein the second conductive section comprises a strip extending on a top surface of the support having a portion disposed substantially parallel to an edge of each of the solar cells to allow an electrical connection to be made between the bonding pad on the front surface of the solar cell and an adjacently disposed portion of the second conductive section.

18. A module as defined in claim 1, wherein the first conductive section and the second conductive section are interdigitated, with the first conductive section being connected to a bus bar extending along a first edge of the support, and the second conductive section being connected to a bus bar disposed along a second edge of the support.

19. A module as defined in claim 1, further comprising:
a ceria doped borosilicate glass supporting member disposed on a surface of each of the semiconductor solar cells; and
wherein each of the plurality of interconnects is composed of a silver-plated nickel-cobalt ferrous alloy material welded to the respective metallic bonding pads on the solar cells, wherein the interconnects are electrically connected to the second conductive section of the conductive layer.

* * * * *